(12) United States Patent
Nozawa et al.

(10) Patent No.: US 8,158,012 B2
(45) Date of Patent: Apr. 17, 2012

(54) FILM FORMING APPARATUS AND METHOD FOR MANUFACTURING LIGHT EMITTING ELEMENT

(75) Inventors: Toshihisa Nozawa, Amagasaki (JP); Shingo Watanabe, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 707 days.

(21) Appl. No.: 12/280,491

(22) PCT Filed: Feb. 20, 2007

(86) PCT No.: PCT/JP2007/053085
§ 371 (c)(1),
(2), (4) Date: Aug. 22, 2008

(87) PCT Pub. No.: WO2007/097329
PCT Pub. Date: Aug. 30, 2007

(65) Prior Publication Data
US 2009/0014412 A1    Jan. 15, 2009

(30) Foreign Application Priority Data
Feb. 22, 2006    (JP) .................... 2006-045343

(51) Int. Cl.
*B29D 11/00*    (2006.01)
*C23C 14/00*    (2006.01)
*C23C 14/32*    (2006.01)
(52) U.S. Cl. ..... 216/25; 427/66; 204/298.12; 204/192.1
(58) Field of Classification Search .................... 216/25; 118/728; 204/298.12, 192.1; 427/66
See application file for complete search history.

(56) References Cited

U.S. PATENT DOCUMENTS

| | | | | |
|---|---|---|---|---|
| 5,622,918 A * | 4/1997 | Nakamura | ..................... | 505/473 |
| 5,667,650 A * | 9/1997 | Face et al. | ................ | 204/298.07 |
| 6,008,143 A | 12/1999 | Yu et al. | | |
| 6,455,579 B1 * | 9/2002 | Satsuki et al. | ................ | 514/457 |
| 6,929,727 B2 * | 8/2005 | Gorokhovsky | .......... | 204/298.41 |
| 6,998,775 B2 * | 2/2006 | Sugiura et al. | ................. | 313/512 |
| 2003/0222575 A1 * | 12/2003 | Yamazaki et al. | ............ | 313/504 |
| 2004/0194702 A1 | 10/2004 | Sasaki et al. | | |
| 2004/0216673 A1 | 11/2004 | Sakata et al. | | |

(Continued)

FOREIGN PATENT DOCUMENTS
CN    1184860 A    6/1998
(Continued)

OTHER PUBLICATIONS
Translater abstract or DE 3734069.*
(Continued)

*Primary Examiner* — Nadine G Norton
*Assistant Examiner* — Mahmoud Dahimene
(74) *Attorney, Agent, or Firm* — Oblon, Spivak, McClelland, Maier & Neustadt, L.L.P.

(57) ABSTRACT

A film forming apparatus is provided with a processing chamber having a substrate holding table for holding a substrate to be processed inside the container; a gas material generation unit arranged outside the processing chamber, for generating a gas material by evaporating or sublimating a film forming source material including a metal; a gas material supply unit for supplying the processing chamber with the gas material; and a transport path for transporting the gas material to the gas material supply unit from the gas material generation unit. The film forming apparatus is characterized in that a metal-containing layer is formed on an organic layer including a light emitting layer on the target substrate.

7 Claims, 7 Drawing Sheets

U.S. PATENT DOCUMENTS

2005/0023129 A1  2/2005  Kadokura et al.
2005/0217584 A1  10/2005  Abiko et al.

FOREIGN PATENT DOCUMENTS

| | | | |
|---|---|---|---|
| DE | 3734069 | * | 4/1989 |
| JP | 2000-048966 | | 2/2000 |
| JP | 2002-339061 | | 11/2002 |
| JP | 2003-525349 | | 8/2003 |
| JP | 2004-14245 | | 1/2004 |
| JP | 2004-263299 | | 9/2004 |
| JP | 2004-307877 | | 11/2004 |
| JP | 2005-038784 | | 2/2005 |
| JP | 2005-48227 | | 2/2005 |
| JP | 2005-216724 | | 8/2005 |
| JP | 2005-281808 | | 10/2005 |
| JP | 2005-330537 | | 12/2005 |
| JP | 2005-336527 | | 12/2005 |
| JP | 2006-12993 | | 1/2006 |
| JP | 2006-040784 | | 2/2006 |

OTHER PUBLICATIONS

L. S. Hung, et al., "Sputter Deposition of Cathodes in Organic Light Emitting Diodes", Journal of Applied Physics, vol. 86, No. 8, XP012048845, Oct. 15, 1999, pp. 4607-4612.

Office Action issued Aug. 9, 2010 in Chinese Application No. 2007800064001 (With English Translation).

Office Action issued Dec. 8, 2010, in China Patent Application No. 200780006400.1 (with English translation).

Office Action issued in Japanese application No. 2006-045343, mailed Aug. 2, 2011 (with English translation).

* cited by examiner

FILM FORMING APPARATUS AND METHOD FOR MANUFACTURING LIGHT EMITTING ELEMENT

FIELD OF THE INVENTION

The present invention relates to a film forming apparatus for forming a film on an organic layer having a light emitting layer, and a method for manufacturing a light emitting element including an organic layer having a light emitting layer.

BACKGROUND OF THE INVENTION

Recently, planar displays capable of being made thin are being brought into practical use in place of conventionally used CRTs (Cathode Ray Tubes). For example, organic electroluminescence devices (i.e., organic EL devices) are highlighted as a next-generation display device owing to its self-luminosity and high-speed responsiveness. Further, organic EL devices are also used as a surface emitting element besides being used for display devices.

The organic EL device has a structure in which an organic layer having an organic EL layer (light emitting layer) is embedded between an anode (positive electrode) and a cathode (negative electrode), and is configured to let the light emitting layer emit light by injecting holes from the anode and electrons from the cathode into the light emitting layer to induce recombination between the holes and the electrons.

Further, the organic layer may further contain, if required, a layer for improving luminous efficiency, such as a hole transport layer or an electron transport layer, between the anode and the light emitting layer or between the cathode and the light emitting layer.

As for an example of a method for forming the above light emitting element, the following method has been conventionally employed. First, an organic layer is formed by a deposition method on a substrate on which an anode formed of ITO (Indium Tin Oxide) is patterned. Herein, the deposition method refers to a method for forming a thin film by depositing evaporated or sublimated material on a target substrate. Thereafter, Al (aluminum) layer serving as a cathode is deposited on the organic layer. The light emitting element thus manufactured is occasionally referred to as "top cathode type" light emitting element.

In this manner, for example, the light emitting element in which the organic layer is formed between the anode and the cathode is manufactured (see, e.g., Patent Document 1).

FIG. 1 schematically shows an exemplary configuration of a conventional deposition device.

Referring to FIG. 1, a film forming apparatus 10 includes a processing chamber 11 having therein an inner space 11A. Installed in the inner space 11A are a deposition source 12 and a substrate holding table 15 facing the deposition source 12. The inner space 11A is exhausted via a gas exhaust line 14 connected to a gas exhaust unit (not shown) such as a vacuum pump or the like to be maintained at a specific depressurized level.

The deposition source 12 is connected to a heater 13 such that a source material 12A contained therein can be heated by the heater 13 to be turned into a gas material by being evaporated or sublimated. The gas material is deposited on a target substrate S held on the substrate holding table 15.

By using the film forming apparatus 10, it is possible to form, e.g., an organic layer (light emitting layer) in a light emitting element, an electrode on the organic layer and the like.

However, when a film is formed by using the conventional deposition device, it is necessary to employ a face-down film formation method in which a film-forming surface of a target substrate is arranged to face downward in order to have the source material evaporated or sublimated from the deposition source in the processing chamber be deposited on the target substrate. Accordingly, if the size of the target substrate is increased, handling the substrate becomes difficult. Therefore, there occurs a problem in that the productivity of the film forming apparatus is deteriorated.

Further, in the conventional deposition device, the material evaporated or sublimated from the deposition source may be adhered to other parts than the target substrate, causing particle generation. This may require an increased frequency of removing the adhered material, which reduces the productivity.

In order to prevent material from being attached to portions other than the target substrate, it is preferable to shorten the distance between the deposition source and the substrate (holding table). However, when placing the target substrate near the deposition source that heats the source material to evaporate or sublimate it, the target substrate or the mask on the target substrate gets heated, and the uniformity in the film thickness may become deteriorated. To that end, the deposition source and the target substrate need to be spaced apart from each other with a specific distance.

Further, film formation using, e.g., sputtering method is advantageous in that the direction of the target substrate is relatively free and the productivity is high. However, in this case, larger damages are inflicted on a target object of film formation compared to film formation using deposition method.

When, for example, film formation is performed on an organic layer having a light emitting layer in an organic EL device or the like, damage inflicted on the organic layer by the sputtering may be problematic. In some cases, the organic layer is damaged to deteriorate the quality of the light emitting element by, e.g., particles of a hard metal such as Al colliding with the organic layer at a high speed by the sputtering or ultraviolet irradiated thereon following plasma excitation.

As for the case where a film is formed on an organic layer, the following is an example thereof.

In, for example, a light emitting element using an organic layer and a metal electrode, luminous efficiency may be reduced due to the difference between work functions of the organic layer and the electrode. In order to suppress such decrease in the luminous efficiency, a specific metal-containing layer (e.g., a metal layer or a metal compound layer) may be formed between the organic layer and the electrode (i.e., on the organic layer). In case of forming the layer for suppressing the decrease in luminous efficiency due to the difference between work functions of the organic layer and the electrode (hereinafter, this layer may be referred to as a "work function adjustment layer"), the organic layer may be damaged depending on film forming method (such as sputtering method). Further, some kinds of materials used for forming the work function adjustment layer are not suitable as a sputtering target.

On the other hand, in case of forming the work function adjustment layer by the conventional deposition method, it is difficult to overcome the aforementioned problems such as difficulty in handling a large-sized substrate and deterioration in the productivity.

Besides, Patent Document 2 describes a film forming apparatus for performing film formation by transporting evaporated or sublimated material. However, Patent Document 2 is silent about problems occurred when forming a film on an organic layer having a light emitting layer, and solutions therefor.

(Patent Document 1) Japanese Patent Application Publication No. 2004-225058

(Patent Document 2) U.S. Pat. No. 6,849,241

SUMMARY OF THE INVENTION

Therefore, it is a general object of the present invention to provide a new and useful film forming apparatus and method for manufacturing a light emitting element.

A first specific object of the present invention is to provide a film forming apparatus capable of forming a metal-containing layer on an organic layer with a high productivity.

A second specific object of the present invention is to provide a method for manufacturing a light emitting element, in which an organic layer having a light emitting layer is formed between a first electrode and a second electrode and a work function adjustment layer is formed between the organic layer and the second electrode, with a high productivity.

In accordance with a first aspect of the invention, the objects are achieved by providing a film forming apparatus including a processing chamber having therein a substrate holding table for holding a substrate; a gas material generation unit arranged outside the processing chamber, for generating gas material by evaporating or sublimating source material containing metal; at least one gas material supply unit for supplying the gas material into the processing chamber; and a transport path for transporting the gas material from the gas material generation unit to the gas material supply unit, wherein the film forming apparatus is configured to form a metal-containing layer on an organic layer including a light emitting layer on the substrate.

In accordance with a second aspect of the invention, the objects are achieved by providing A method for manufacturing a light emitting element including a first film forming step of forming a metal-containing layer on an organic layer including a light emitting layer; and a second film forming step of forming an electrode on the metal-containing layer, wherein, in the first film forming step, a film is formed by supplying a gas material obtained by evaporating or sublimating a source material onto the organic layer via a transport path.

EFFECT OF THE INVENTION

In accordance with the present invention, it is possible to provide a film forming apparatus capable of forming a metal-containing layer on an organic layer with a high productivity.

Further, it is possible to provide a method for manufacturing a light emitting element, in which an organic layer having a light emitting layer is formed between a first electrode and a second electrode and a work function adjustment layer is formed between the organic layer and the second electrode, with a high productivity.

DESCRIPTION OF REFERENCE NUMERALS

Figure 1:
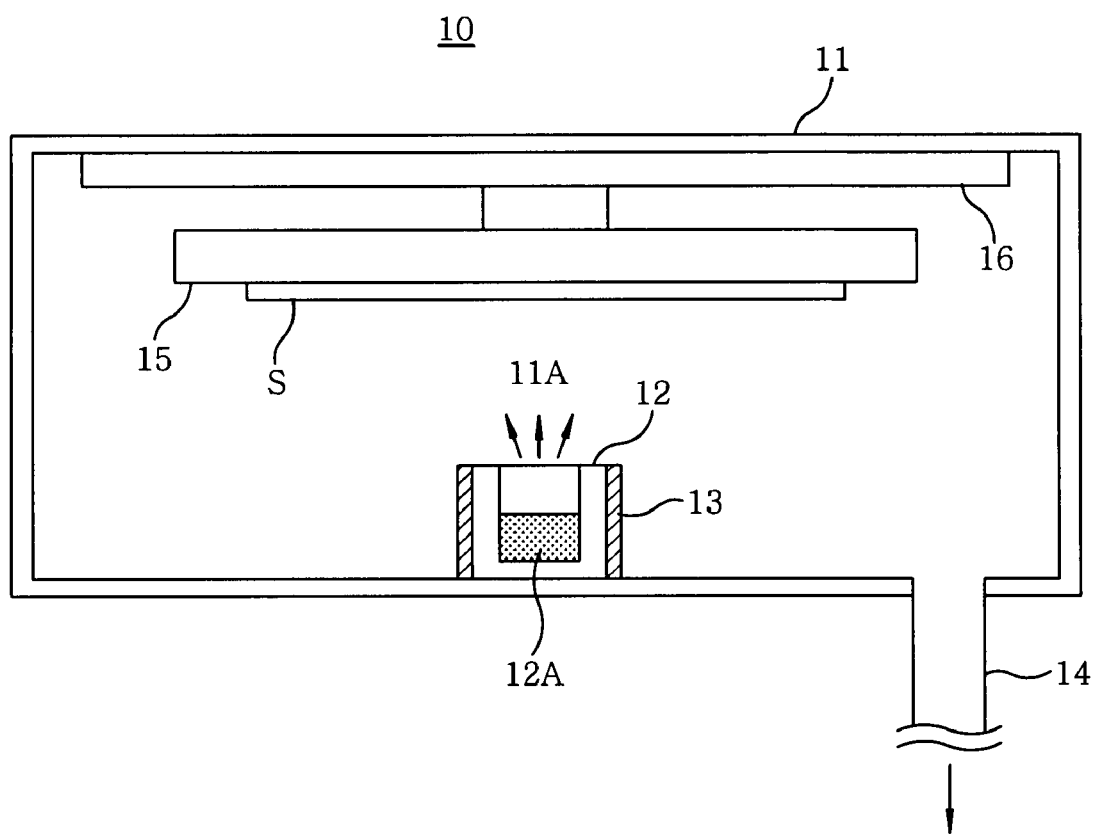
FIG. 1 schematically shows a conventional film forming apparatus.

100, 100A, 100B film forming apparatus
101, 101B processing chamber
102 substrate holding table
103 moving rail
104, 104A gas material supply unit
105, 105A supply unit main body
106, 106A rectifying plate
107, 107A filter plate
108 transport path
109 gas material generation unit
110 source material container
110A film forming source material
111 heating unit
112 carrier gas supply line
200 sputtering film formation device
201 receding portion
202A, 202B target
203 power supply
204 gas supply unit
205 gas channel
206 gas hole
207 gas supply line
300 light emitting element
301 substrate
302 anode
303 leader line
304 organic layer
304A work function adjustment layer
305 cathode
306 protection layer

DETAILED DESCRIPTION OF THE EMBODIMENT

A film forming apparatus in accordance with the present invention is characterized in that it includes a processing chamber having therein a substrate holding table for holding a substrate; a gas material generation unit arranged outside the processing chamber, for generating gas material by evaporating or sublimating source material containing metal; at least one gas material supply unit for supplying the gas material into the processing chamber; and a transport path for transporting the gas material from the gas material generation unit to the gas material supply unit, wherein the film forming apparatus is configured to form a metal-containing layer on an organic layer including a light emitting layer on the substrate.

The above film forming apparatus is configured such that the gas material generated by evaporating or sublimating the film forming source material is transported via the transport path and supplied to the vicinity of the target substrate in the processing chamber. Thus, compared to the conventional deposition device, the direction of supplying the gas material may be chosen with a higher degree of freedom, and the direction of holding the target substrate is less restricted. Therefore, it is possible to perform what is called as "face-up" film formation in which the film forming surface of the target substrate is arranged to face upward (i.e., facing the direction of gravity), and the film formation can be performed more easily on a large-sized substrate.

Moreover, in the above film forming apparatus is characterized in that, owing to the presence of the transport path for transporting the gas material, the gas material generation unit for evaporating or sublimating the film forming source material can be installed separately from the gas material supply unit for supplying the gas material obtained by evaporating or sublimating the film forming source material.

Therefore, even when the gas material supply unit is located near the target substrate or the substrate holding table, the target substrate or the substrate holding table is hardly affected by heating. Hence, the gas material supply unit and the target substrate can be arranged close to each other. As a consequence, the amount of film formed on other portions than the target substrate is suppressed, so that the use efficiency of the source material is improved. Further, since the maintenance frequency is reduced, the productivity is enhanced.

With the film forming apparatus of the above, a metal-containing layer (e.g., a work function adjustment layer) can be formed on an organic layer having a light emitting layer while reducing damages to the organic layer and ensuring high productivity.

Hereinafter, the embodiments of the present invention will be described with reference to the accompanying drawings, which form a part hereof.

First Embodiment

Figure 2:
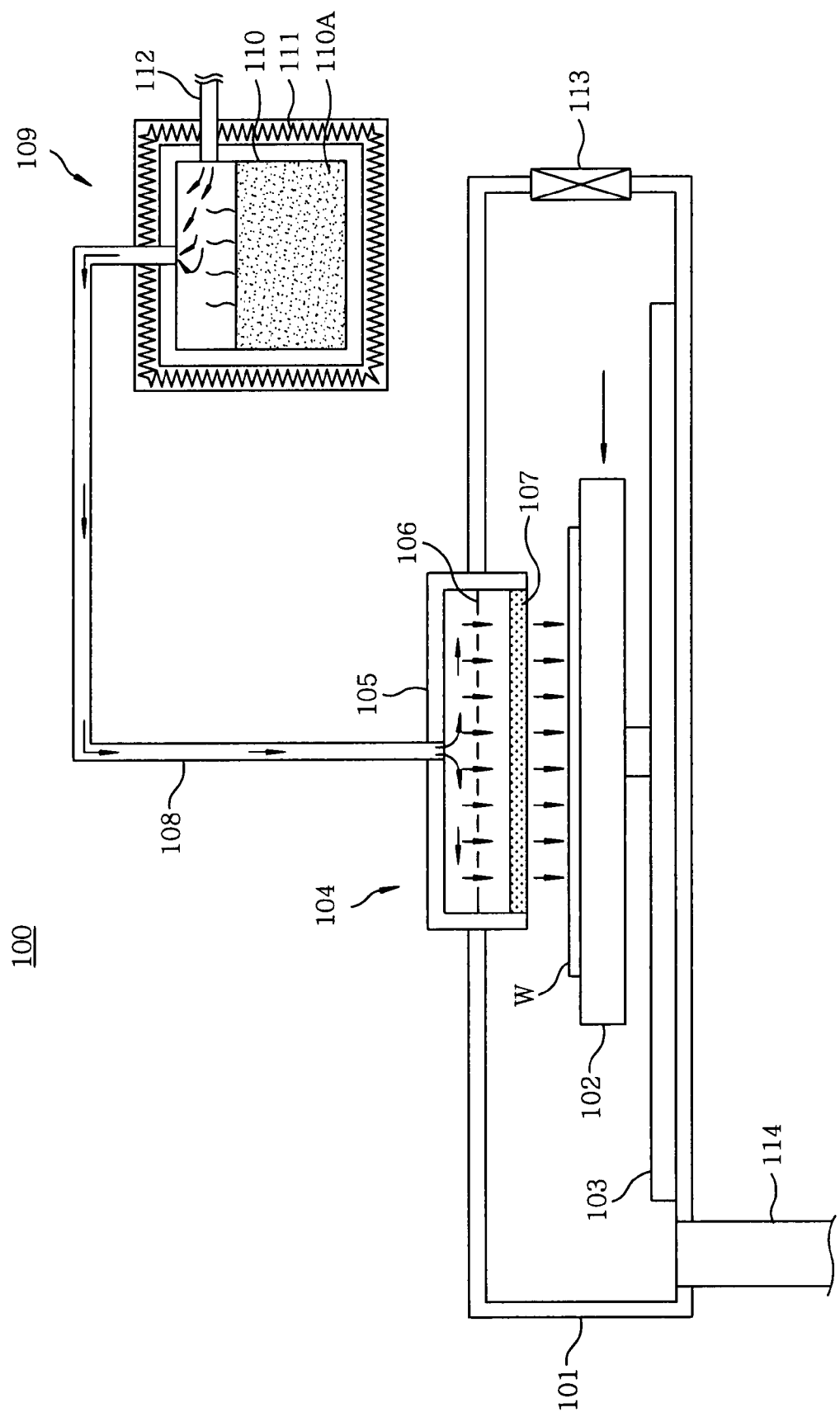
FIG. 2 schematically shows a film forming apparatus in accordance with a first embodiment of the present invention.

FIG. 2 is a cross sectional view schematically showing a film forming apparatus 100 in accordance with a first embodiment of the present invention.

Referring to FIG. 2, the film forming apparatus 100 in accordance with the present embodiment includes a processing chamber 101 having therein a substrate holding table 102 for holding a target substrate W; and a gas material generation unit 109 for retaining therein a film forming source material 110A, located outside of the processing chamber 101.

The gas material generation unit 109 generates a gas material by evaporating or sublimating the film forming source material 110A. The gas material generated in the gas material generation unit 109 is transported to a gas material supply unit 104 installed in the processing chamber 101 via a transport path 108 connected to the gas material generation unit 109. Further, the gas material transported to the gas material supply unit 104 is supplied to vicinity of the target substrate W in the processing chamber 101. Thus, a film is formed on the target substrate W.

Further, the processing chamber 101 is configured such that the inside thereof can be exhausted via a gas exhaust line 114 connected to a gas exhaust unit (not shown) such as a vacuum pump or the like to be held in a specified depressurized state.

The gas material generation unit 109 has a source material container 110, and the source material container 110 stores therein the film forming source material 110A in liquid or solid state. A heating unit 111 formed of, e.g., a heater, is installed outside the source material container 110, so that the film forming source material 110A can be evaporated or sublimated by being heated.

Moreover, the source material container 110 is connected to a carrier gas supply line 112 for supplying a carrier gas formed of a nonreactive gas such as Ar, He or the like. The gas material formed in the source material container 110 is supplied into the processing chamber 101 together with the carrier gas via the transport path 108 to the gas material supply unit 104.

The gas material supply unit 104 has a supply unit main body 105 of cylindrical or housing-like shape connected to the transfer port 108 in a manner that the gas material can be supplied thereinto via the transfer port 108.

Furthermore, a rectifying plate 106 for controlling a flow of the gas material is installed in the supply unit main body 105. The rectifying plate 106 is formed of, e.g., a porous plate having a plurality of gas holes. By installing the rectifying plate 106, the supply amount of the gas material is more uniformly distributed on the target substrate W. Herein, it is also possible to install more than one rectifying plate.

Besides, a filter plate 107 formed of, e.g., a porous metal (metal filter) is installed at a side of the supply unit main body 105 that faces the target substrate W. The gas material is supplied into the processing chamber 101 via the filter plate 107. Thus, particles contained in the gas material are removed, thereby improving the quality of a film to be formed.

In addition, the substrate holding table 102 can be moved according to the film formation (the supply of the gas material). The substrate holding table 102 is movable in a horizontal direction on a moving rail 103 installed on a bottom surface of the processing chamber 101 (on a side facing the gas material supply unit 104). Since the substrate holding table 102 can be moved during the film formation, the uniformity in film formation on the surface of the target substrate is improved.

Further, a gate valve 113 is installed at the processing chamber 101. For example, the gate valve 113 is installed on a side of the processing chamber 101 where the processing chamber 101 is connected to a transfer unit (not shown) such as a vacuum transfer chamber or the like. By opening the gate valve 113, the target substrate W can be carried into and out of the processing chamber 101.

With the configuration of the film forming apparatus 100 in accordance with the present embodiment, the gas material formed by evaporating or sublimating the film forming source material 110A is transported to the vicinity of the target substrate W in the processing chamber 101 via the transport path 108. Therefore, the direction in which the gas material is supplied can be chosen with a higher degree of freedom than in the conventional deposition device. For instance, the degree of freedom is increased in determining the location of the gas material supply unit 104 or the orientation in which the gas material supply unit 104 is to be installed (or the direction in which the gas material is to be supplied).

Accordingly, the degree of freedom is enhanced in the orientation of the target substrate W, i.e., the location or orientation of the substrate holding table 102 to be installed. As a result, it is possible to carry out what is known as "face-up" film formation, in which the film forming surface of the target substrate W is arranged to face upward, and the film formation on a large-sized substrate becomes easier.

Further, the film forming apparatus 100 in accordance with the present embodiment has the transport path 108 for transporting the gas material from the gas material generation unit 109 to the gas material supply unit 104. For this reason, the gas material generation unit 109 and the gas material supply unit 104 can be installed separately from each other. For example, in the present embodiment, the gas material generation unit 109 is installed outside the processing chamber 101, whereas the gas material supply unit 104 is installed at an opening of the processing chamber 101 in a manner to face the inside (or the target substrate) of the processing chamber 101.

As a consequence, the amount of film formed on other portions than the target substrate is reduced, and thus the use efficiency of the material is enhanced. Further, the maintenance frequency is reduced, thereby improving the productivity of the film forming apparatus.

With the film forming apparatus 100 of the present embodiment, a metal-containing layer (e.g., a work function adjustment layer) can be formed on the organic layer having the light emitting layer in the organic EL device with a high productivity. If a film is formed on such an organic layer by the conventional sputtering method, the organic layer gets easily damaged. However, by using the film forming apparatus described above, it is possible to reduce damages inflicted on the organic layer and perform film formation with a high productivity.

Further, light emitting elements having a light emitting layer tend to be manufactured with a large-sized substrate accordingly as the display device becomes larger. In this case, the film forming apparatus in accordance with the present embodiment, which enables the face-up film formation, achieves a higher productivity than the conventional one.

When, for example, fabricating a bottom emission type light emitting element, a cathode (top cathode) formed at an upper layer is preferably made of a material having a high reflectivity for the emitted light. It is preferable to use, for example, Ag for the cathode.

If the cathode is made of Ag, it is preferable that an Li layer is used as a layer (work function adjustment layer) for suppressing deterioration in the luminous efficiency formed between the electrode and the organic layer having the light emitting layer.

Forming, for example, the Li layer by sputtering method is problematic in that the organic layer may get damaged and a target material used for sputtering is difficult to be formed.

Li is disadvantageous in that its surface is prone to change (e.g., nitridation) when exposed to the atmosphere. Further, Li is not suitable for a large-sized target material and is difficult to be handled, e.g., transported. For this reason, it has been difficult to employ the sputtering method in forming a work function adjustment layer with Li.

Moreover, when forming an Li layer by the conventional deposition method, a large amount of film may be formed at an inner portion of the processing chamber (other than the target substrate) depending on the processing conditions. Therefore, more time may be required for the apparatus maintenance, which deteriorates the productivity.

However, with the film forming apparatus 100 in accordance with the present embodiment, the work function adjustment layer formed of an Li layer can be formed on an organic layer including a (organic) light emitting layer in an organic EL device while suppressing damages inflicted on the organic layer and ensuring a high productivity.

Further, the film forming apparatus of the present invention is not limited to the film forming apparatus described in the present embodiment, but can be variously modified as will be illustrated hereinafter.

Second Embodiment

Figure 3:
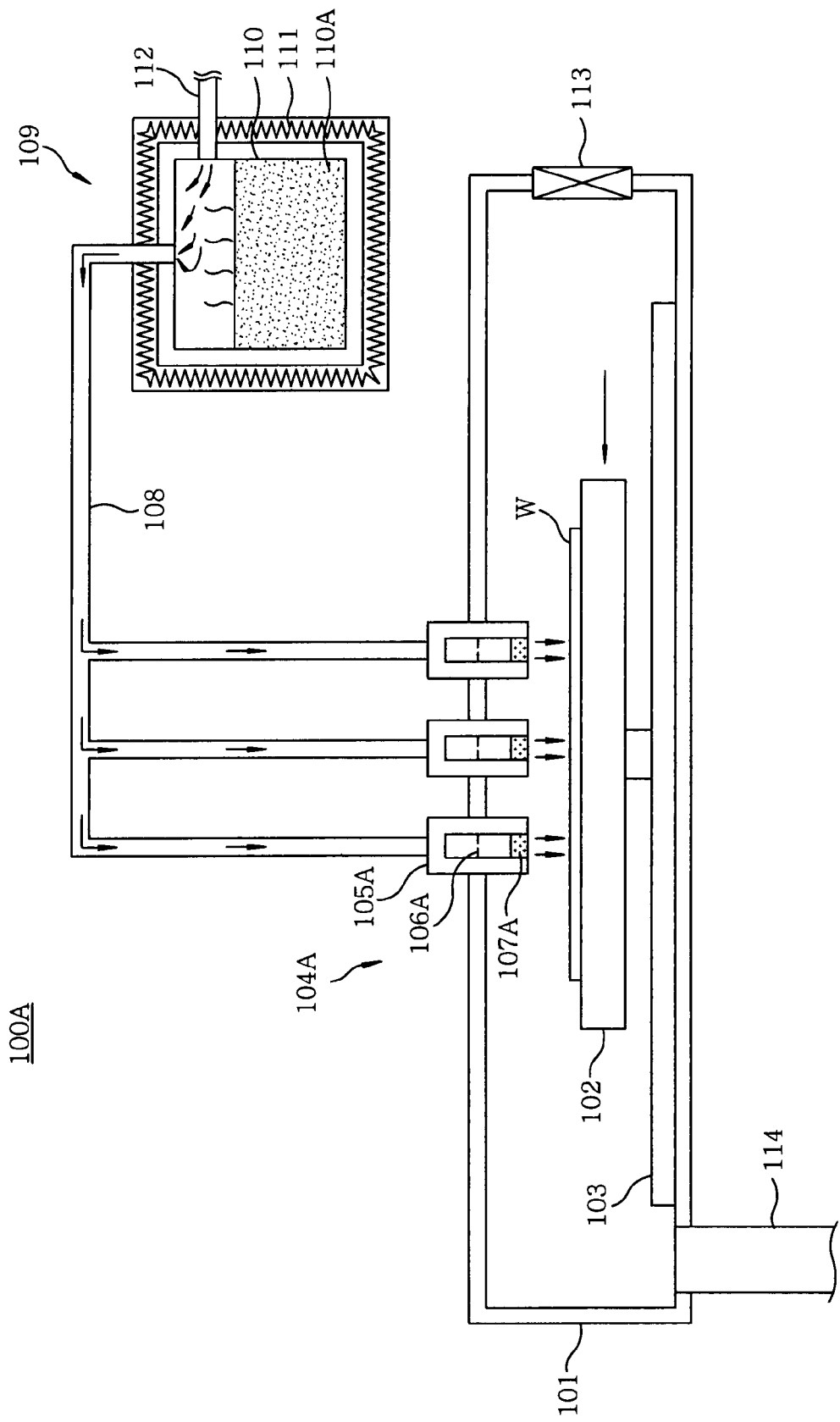
FIG. 3 schematically shows a film forming apparatus in accordance with a second embodiment of the present invention.

FIG. 3 provides a cross sectional view schematically showing a film forming apparatus in accordance with a second embodiment of the present invention. In FIG. 3, like reference numerals will be used for like parts identical to those described in the first embodiment, and redundant description thereof will be omitted.

As shown therein, a film forming apparatus 100 in accordance with the present embodiment is characterized in that a plurality of gas material supply units 104A, each corresponding to the gas material supply unit 104 of the first embodiment, are arranged along a movement direction of the substrate holding table 102. Each of the gas material supply units 104A includes a supply unit main body 105A, a rectifying plate 106A and a filter plate 107A, respectively corresponding to the supply unit main body 105, the rectifying plate 106 and the filter plate 107 of the first embodiment.

Each of the gas material supply units 104A is smaller in dimension (i.e., in length measured in the movement direction of the substrate holding table 102) than the gas material supply unit 104. Therefore, more than one gas material supply unit 104A can be arranged along the movement direction of the substrate holding table. As a consequence, it is possible to achieve a desired film thickness or film forming speed by installing a plurality of gas material supply units.

Third Embodiment

Figure 4:
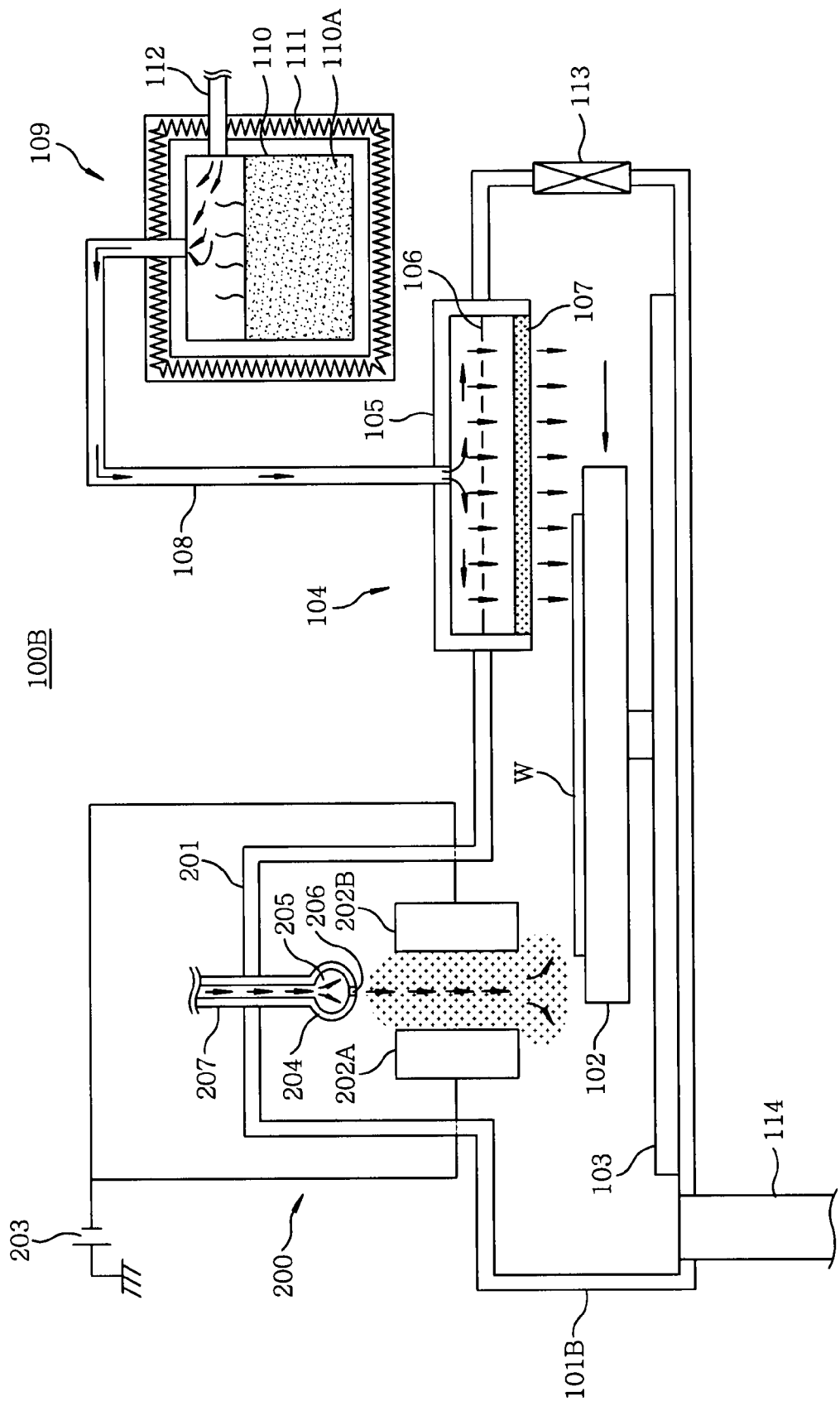
FIG. 4 schematically shows a film forming apparatus in accordance with a third embodiment of the present invention.

FIG. 4 is a cross sectional view schematically illustrating a film forming apparatus in accordance with a third embodiment of the present invention. In FIG. 4, like reference numerals will be used for like parts identical to those described in the first embodiment, and redundant description thereof will be omitted.

As shown therein, a film forming apparatus 100B in accordance with the present embodiment further includes a sputtering film formation device 200 in addition to the elements of the first embodiment, and is capable of performing film formation by sputtering method.

Therefore, the film forming apparatus 100B in accordance with the present embodiment is configured such that, for example, the film formation (e.g., forming the cathode on the work function adjustment layer) by sputtering method can be performed in a depressurized atmosphere immediately following the film formation (e.g., forming the work function adjustment layer) by evaporating or sublimating the film forming source material 110A as described in the first embodiment.

The sputtering film formation device 200 is installed in the processing chamber 100B such that it is almost entirely accommodated in a receding portion 201 in the processing chamber 100B (which corresponds to the processing chamber 101 of the first embodiment). The sputtering film formation device 200 has voltage applying targets 202A and 202b facing each other and a gas supply unit 204 for supplying a processing gas of, e.g., Ar or the like, between the voltage applying targets 202A and 202B to which voltages are applied. The processing gas is plasma-excited by the voltages applied to the voltage applying targets 202A and 202B by a power supply 203.

The gas supply unit 204 has a structure that extends in a direction substantially perpendicular to the movement direction of the substrate holding table 102, and is arranged to face the substrate holding table 102 via the voltage applying targets 202A and 202B.

Further, the gas supply unit 204 is of a hollow pipe structure having a gas channel 205 therein. Therefore, the processing gas of, e.g., Ar or the like, is supplied from a gas supply source (not shown) installed outside the processing chamber 101B to the gas channel 205 via a gas supply line 207. The processing gas supplied to the gas channel 205 is then supplied to a space between the voltage applying targets 202A and 202B via a plurality of gas holes 206 formed at the gas supply unit 204.

The following is description of film formation performed by using the sputtering film formation device 200 in the film forming apparatus 100B.

First, the processing gas for plasma excitation of, e.g., Ar or the like, is supplied from the gas supply unit 204 to the space between the voltage applying targets 202A and 202B. Herein, the electric power supplied by the power supply 203 is applied to the voltage applying targets 202A and 202B, respectively, so that the plasma is excited in the space to generate ions.

The targets 202A and 202B are subject to sputtering by Ar ions thus generated, and thus, a film is formed on the target substrate W held on the substrate holding table 102.

In the film forming apparatus 100B, since the target substrate W is spaced apart from the space where the plasma is excited (which is the space between the voltage applying targets 202A and 202B), the target substrate W is hardly affected by damages caused by ion collision or ultraviolet accompanied with the plasma excitation. Further, film forming particles generated by sputtering are transported by the processing gas flow toward the substrate holding table 102 to reach the target substrate W.

With the film forming apparatus 100B of the present embodiment, it is possible to carry out a first film formation by evaporating or sublimating the film forming source material 110A as described in the first embodiment, and, immediately following the first film formation, the second film formation by the sputtering method using the sputtering film formation device 200. In this case, the substrate holding table 102 is moved after the first film formation is completed, and the second film formation is carried out in a state where the target substrate W is positioned directly below the sputtering film formation device 200.

Therefore, it is possible to perform the first film forming process for forming a work function adjustment layer on an organic layer having a (organic) light emitting layer in an organic EL device, and then the second film formation process for forming a cathode (top cathode) on the work function adjustment layer, in a continuous manner under a depressurized atmosphere.

When, for example, forming a work function layer with an Li layer, a surface of the Li layer may be changed (e.g., nitrided). When the Li layer is exposed to a space under the atmospheric pressure, its surface undergoes nitridation, which makes it impossible to obtain desired electrical characteristics.

With the film forming apparatus of the present embodiment, a cathode (top cathode) made of, e.g., Ag can be formed in a depressurized space immediately after a work function adjustment layer (e.g., Li layer) is formed. As a result, the work function adjustment layer can be effectively protected from, e.g., nitridation or the like.

Although the present embodiment has been described as to the case where the film is formed by using two targets facing each other, the present invention is not limited thereto. The film formation may also be performed by, e.g., a conventional sputtering method using a single target.

Fourth Embodiment

Hereinafter, a method for manufacturing a light emitting element in accordance with a fourth embodiment of the present invention will be described sequentially with reference to FIGS. 5A to 5G. In the following drawings, like reference numerals will be used for like parts identical to those described above, and redundant description thereof will be omitted.

Figure 5A:
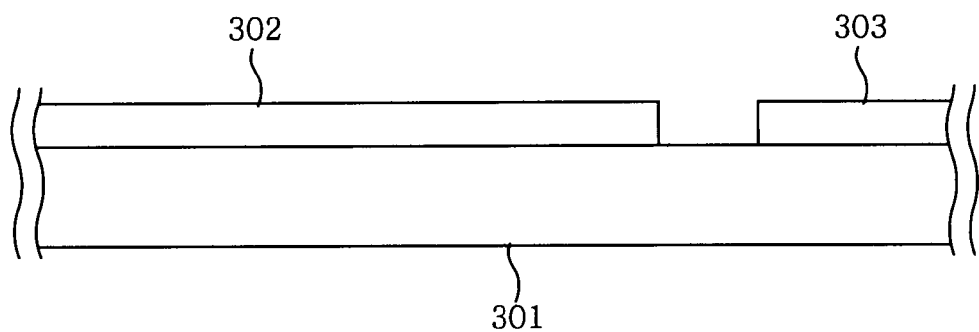
FIG. 5A is a view for describing a method for manufacturing a light emitting element in accordance with a fourth embodiment of the present invention.

First, in a process shown in FIG. 5A, an anode 302 made of a transparent material such as ITO or the like and a leader line 303 a cathode, wherein the cathode is to be formed in a later process, are formed on a transparent substrate 301 made of, e.g., glass or the like. Thus, an electrode-attached substrate is prepared. In this case, the anode 302 (and the leader line 303) is formed by, e.g., sputtering method or the like.

Further, a control device, e.g., a TFT (Thin Film Transistor) or the like, for controlling light emission of a light emitting element may be embedded in the substrate 301. When, for example, the light emitting element in the present embodiment is used for a display device, the control device such as a TFT or the like may be embedded in each pixel.

In this case, a source electrode of the TFT is connected to the anode 302, and a gate electrode and a drain electrode of the TFT are connected to a gate line and a drain line formed in a grid pattern, thereby controlling the display of each pixel. At this time, the leader line 303 is connected to a specified control circuit (not shown). A driving circuit of the display device is referred to as an active matrix driving circuit, which is not shown in the drawings.

Figure 5B:
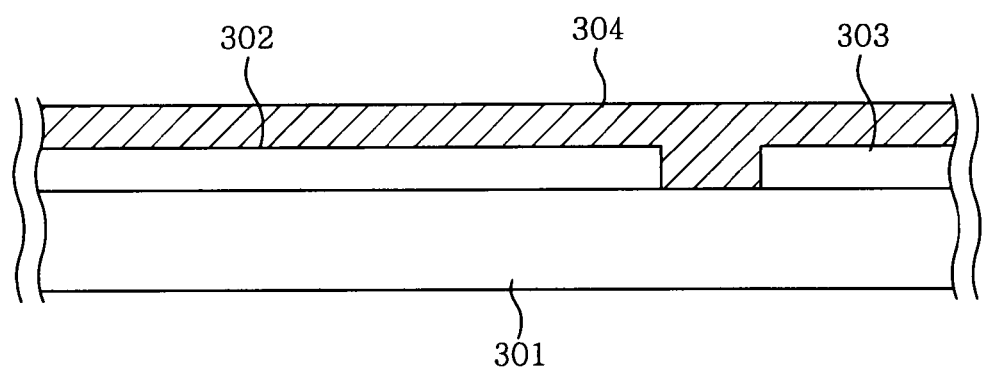
FIG. 5B is another view for describing the method for manufacturing the light emitting element in accordance with the fourth embodiment of the present invention.

Next, in a process described in FIG. 5B, an organic layer 304 having a light emitting layer (organic EL layer) is formed by deposition method on the anode 302, the leader line 303 and the substrate 301, thereby covering the exposed portions of the anode 302, the leader line 303 and the substrate 301.

Further, the organic layer 304 may be structured to include, e.g., a hole transport layer, a hole injection layer or the like formed between the light emitting layer and the anode 302, thereby improving the luminous efficiency of the light emitting layer. Herein, either one or both of the hole transport layer and the hole injection layer may be omitted.

Likewise, the organic layer 304 may be structured to include, e.g., an electron transport layer, an electron injection layer or the like formed between the light emitting layer and the cathode 305 that is to be formed in a later process, thereby improving the luminous efficiency of the light emitting layer. Further, either one or both of the electron transport layer and the electron injection layer may be omitted.

Figure 5C:
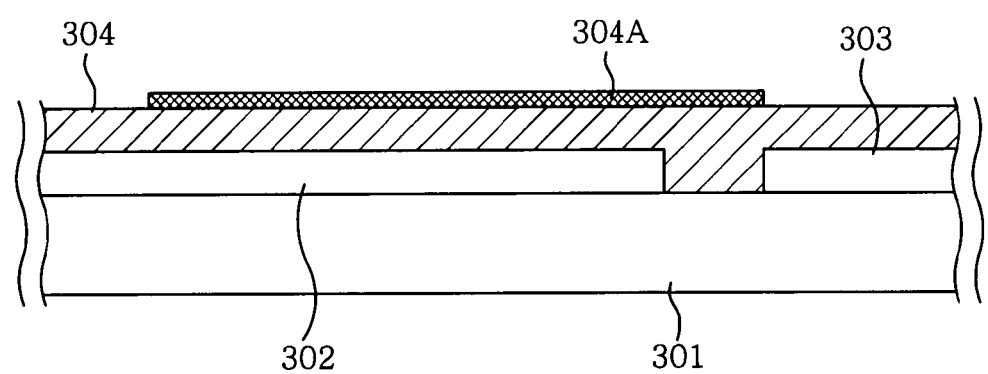
FIG. 5C is still another view for describing the method for manufacturing the light emitting element in accordance with the fourth embodiment of the present invention.

Thereafter, in a process shown in FIG. 5C, the film forming apparatus of any one of the first to the third embodiment is used to form the work function adjustment layer 304A made of, e.g., an Li layer on the organic layer 304 by patterning with a pattern mask. For example, the film formation by using the film forming apparatus 100 described in the first embodiment (FIG. 2) is as follows.

First, in the gas material generation unit 109, the film forming source material 110A formed of, e.g., solid-state Li, is heated by the heating unit 111 to turn into a gas material through sublimation. The gas material is transported to the gas material supply unit 104 via the transport path 108 together with a carrier gas formed of, e.g., Ar supplied from the carrier gas supply line 112.

The gas material transported to the gas material supply unit 104 is supplied via the filter plate 107 to the vicinity of the target substrate W (which corresponds to the substrate 301) in the processing chamber 101. In this manner, the work function adjustment layer 304A formed of an Li layer is formed on the organic layer 304 formed on the target substrate W (the substrate 301).

Figure 5D:
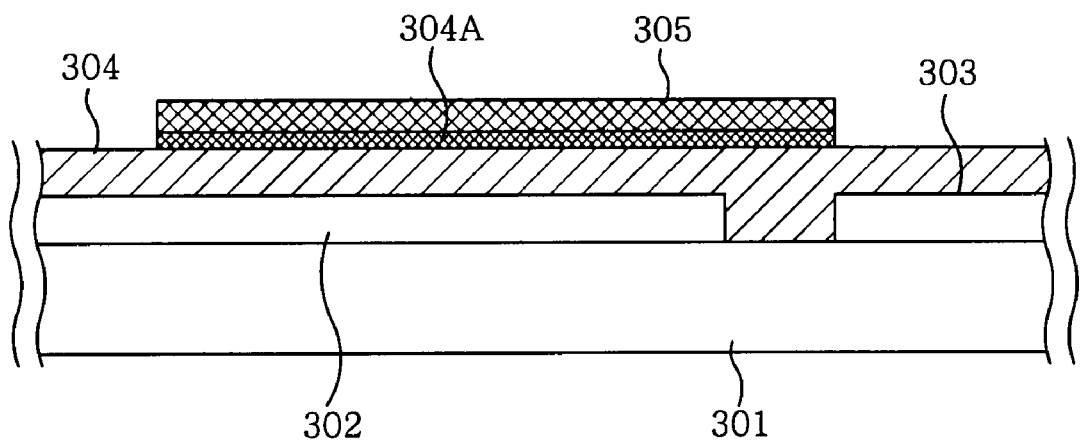
FIG. 5D is still another view for describing the method for manufacturing the light emitting element in accordance with the fourth embodiment of the present invention.

Next, in a process depicted in FIG. 5D, the cathode 305 made of, e.g., Ag is patterned to be formed on the organic layer 304 by sputtering using a pattern mask.

When, for example, the processes of FIGS. 5C and 5D are carried out by the film forming apparatus 100B described in the third embodiment (FIG. 4), it is possible to form the cathode 305 made of, e.g., Ag under the depressurized space consecutively after the work function adjustment layer (e.g., Li layer) 304A is formed. As a consequence, the work function adjustment layer 304A can be effectively protected from nitridation or the like.

Figure 5E:
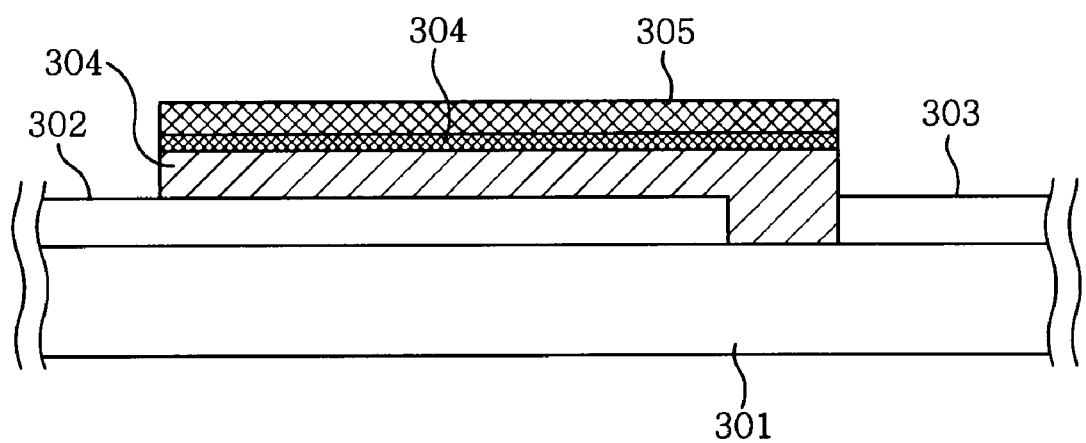
FIG. 5E is still another view for describing the method for manufacturing the light emitting element in accordance with the fourth embodiment of the present invention.

Next, in a process illustrated in FIG. 5E, the organic layer 304 is etched by, e.g., plasma etching while using as a mask the cathode electrode 305 patterned in the process shown in FIG. 5D, thereby patterning the organic layer 304. In this process, the patterning of the organic layer 304 is performed by etching that removes portions of the organic layer 304 that need to be peeled off (e.g., the portion on the leader line 303 or the like or where the light emitting layer is not to be formed).

By patterning the organic layer by etching using the cathode 305 as a mask as described above, it is possible to avoid various problems that might occur when patterning the organic layer by mask deposition method. For example, the accuracy of patterning the deposition layer (the organic layer 304) can be maintained without being affected by mask deformation caused by temperature increase of the mask during the deposition process. Further, it is possible to reduce particles that might otherwise be generated when attaching and detaching the mask.

Figure 5F:
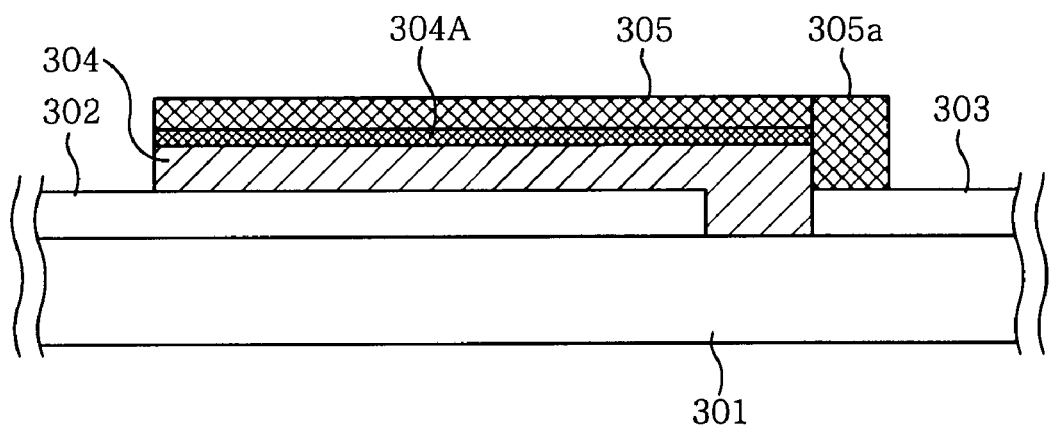
FIG. 5F is still another view for describing the method for manufacturing the light emitting element in accordance with the fourth embodiment of the present invention.

Thereafter, in a process described in FIG. 5F, a connection line 305a for electrically connecting the cathode 305 to the leader line 303 is patterned by, e.g., sputtering using a pattern mask.

Figure 5G:
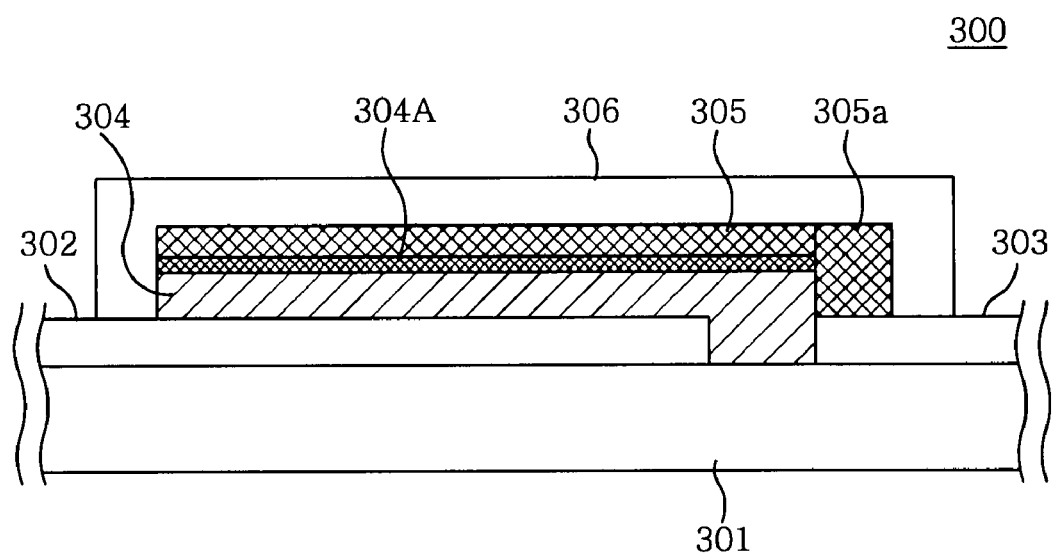
FIG. 5G is still another view for describing the method for manufacturing the light emitting element in accordance with the fourth embodiment of the present invention.

Then, in a process shown in FIG. 5G, an insulating protection layer 306 made of, e.g., silicon nitride (SiN), is formed on the substrate 301 by CVD method using a pattern mask to cover a part of the anode 302, a part of the leader line 303, the organic layer 304, the cathode 305 and the connection line 305a.

In this manner, the light emitting element 300, in which the organic layer 304 is formed between the anode 302 and the cathode 305, and the work function layer 304A is formed between the organic layer 304 and the cathode 305, can be formed on the substrate 301. The light emitting element 300 is occasionally referred to as an organic EL device.

When the voltage is applied between the anode 302 and the cathode 305, holes from the anode 302 and electrons from the cathode 305 are injected into the light emitting layer in the organic layer 304, and the holes and the electrons are recombined therein, so that the light emitting element 300 emits light.

The light emitting layer may be made of, e.g., polycyclic aromatic hydrocarbon, hetero aromatic hydrocarbon, organometallic complex compound or the like.

For example, the light emitting layer can be formed by using aluminum-quinolinol complex (Alq3) as a host material and Rubrene as a dopant. However, it can also be formed by other materials without being limited thereto.

For example, the anode 302 is formed with a thickness of about 100 nm to 200 nm; the organic layer 303 is formed with a thickness of about 50 nm to 200 nm; the cathode 304 is formed with a thickness of about 50 nm to 300 nm; and the work function adjustment layer 304A is formed with a thickness of about 0.1 nm to 10 nm.

Further, the light emitting element 300 is applicable to, for example, a display device (organic EL display device) or a surface emitting element (lighting device, light source or the like). However, it can also be used for other electronic appliances without being limited thereto.

By using the above method for manufacturing a light emitting element in accordance with the present embodiment, the light emitting element 300 can be manufactured with a high productivity.

For example, in a process of FIG. 5C, the work function adjustment layer 304A is formed by supplying the gas material generated by evaporating or sublimating the film forming source material onto the organic layer 304 via a transport path. In this manner, the effects of the first embodiment can be achieved.

In the above manufacturing method for instance, the degree of freedom in setting the direction of supplying the gas material is increased, and restriction in the orientation of holding the target substrate is decreased. Therefore, the face-up film formation can be carried out, and the film formation can be easily performed on a large-sized substrate.

Moreover, the amount of film formed at portions other than the target substrate is decreased. In this manner, the use efficiency of the source material is increased, and the maintenance frequency is decreased, thereby enhancing the productivity.

In the above manufacturing method, forming the work function adjustment layer with Li on the organic layer, which is difficult when using the conventional sputtering method, can be achieved while suppressing damages to the organic layer and ensuring high productivity.

While the invention has been shown and described with respect to the embodiments, it will be understood by those skilled in the art that various changes and modification may be made without departing from the scope of the invention as defined in the following claims.

INDUSTRIAL APPLICABILITY

In accordance with the present invention, it is possible to provide a film forming apparatus capable of forming a metal-containing layer on an organic layer with a high productivity.

Further, it is possible to provide a method for manufacturing a light emitting element, in which an organic layer having a light emitting layer is formed between a first electrode and a second electrode and a work function adjustment layer is formed between the organic layer and the second electrode, with a high productivity.

This application is based upon and claims priority of Japanese Patent Application No. 2006-045343 filed on Feb. 22, 2006, the entire disclosure of which is incorporated herein by reference.

What is claimed is:
1. A method for manufacturing a light emitting element comprising:
   a first film forming step of forming a metal-containing layer on an organic layer, wherein the organic layer is formed on a substrate accommodated in a processing chamber and includes a light emitting layer; and a second film forming step of forming an electrode on the metal-containing layer, wherein, in the first film forming step, the metal-containing layer is formed by supplying a gas material and a carrier gas onto the organic layer via a transport path which is connected to the processing chamber, wherein the gas material is generated by evaporating or sublimating a source material in a space arranged outside the processing chamber, and wherein, in the second film forming step, the electrode is formed by a sputtering method.

2. The method of claim 1, wherein the metal-containing layer is an Li layer.

3. The method of claim 1, wherein the electrode is made of Ag.

4. The method of claim 1, wherein, in the second film forming step, the electrode is formed while using two targets facing each other.

5. The method of claim 1, further comprising:
an etching step of etching the organic layer while using the electrode as a mask.

6. The method of claim 1, wherein, in the first film forming step, the substrate is held in a manner that a film forming surface of the substrate faces upward.

7. The method of claim 1, wherein, in the first film forming step, the gas material is supplied to a vicinity of the substrate.

* * * * *